(12) United States Patent
Nagaraja et al.

(10) Patent No.: US 7,968,923 B2
(45) Date of Patent: Jun. 28, 2011

(54) IMAGE SENSOR ARRAY WITH CONFORMAL COLOR FILTERS

(75) Inventors: Satyadev Nagaraja, San Jose, CA (US); Vincent Venezia, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 674 days.

(21) Appl. No.: 12/047,175

(22) Filed: Mar. 12, 2008

(65) Prior Publication Data

US 2009/0230394 A1  Sep. 17, 2009

(51) Int. Cl.
*H01L 31/062* (2006.01)
(52) U.S. Cl. .. 257/294; 257/292; 257/440; 257/E31.121
(58) Field of Classification Search .................. 257/294, 257/440, E31.121
See application file for complete search history.

(56) References Cited

U.S. PATENT DOCUMENTS

| | | | |
|---|---|---|---|
| 6,307,243 B1 | 10/2001 | Rhodes | |
| 6,362,513 B2 * | 3/2002 | Wester | 257/432 |
| 6,495,813 B1 | 12/2002 | Fan et al. | |
| 6,808,960 B2 * | 10/2004 | Yamamoto | 438/107 |
| 2006/0138487 A1* | 6/2006 | Kim | 257/292 |

OTHER PUBLICATIONS

Agranov, G., Berezin, V., and Tsai, R., "Crosstalk and Microlens Study in a Color CMOS Image Sensor," IEEE Transactions on Electron Devices, vol. 50, No. 1, Jan. 2003, pp. 4-11.

Hsu, T. et al. "A High-Efficiency CMOS Image Sensor With Air Gap in situ MicroLens (AGML) Fabricated by 0.18-μm CMOS Technology," IEEE Electron Device Letters, vol. 26, No. 9, Sep. 2005, pp. 634-636.

* cited by examiner

*Primary Examiner* — Ken A Parker
*Assistant Examiner* — Jose R Diaz
(74) *Attorney, Agent, or Firm* — Blakely Sokoloff Taylor and Zafman LLP

(57) ABSTRACT

An image sensor pixel includes a photo-sensor region, a microlens, a first color filter layer, and a second color filter layer. The photo-sensor region is disposed within a semiconductor die. The microlens is disposed on the semiconductor die in optical alignment with the photo-sensor region. The first color filter layer is disposed between the photo-sensor region and the microlens. The second color filter layer is disposed on an opposite side of the microlens as the first color filter layer.

15 Claims, 9 Drawing Sheets

CROSS-SECTION ALONG A-A'

IMAGE SENSOR ARRAY WITH CONFORMAL COLOR FILTERS

TECHNICAL FIELD

This disclosure relates generally to image sensors, and in particular but not exclusively, relates to CMOS color image sensor arrays.

BACKGROUND INFORMATION

Image sensors have become ubiquitous. They are widely used in digital still cameras, cellular phones, security cameras, as well as, medical, automobile, and other applications. The technology used to manufacture image sensors, and in particular, complementary metal-oxide-semiconductor ("CMOS") image sensors ("CIS"), has continued to advance at great pace. For example, the demands of higher resolution and lower power consumption have encouraged the further miniaturization and integration of these image sensors.

FIG. 1A illustrates a conventional front side illuminated CIS 100. The front side of CIS 100 is the side of substrate 105 upon which the pixel circuitry is disposed and over which metal stack 110 for redistributing signals is formed. The metal layers (e.g., metal layer M1 and M2) are patterned in such a manner as to create an optical passage through which light incident on the front side CIS 100 can reach the photosensitive or photodiode ("PD") region 115. To implement a color CIS, the front side further includes a color filter layer 120 disposed under a microlens 125. Microlens 125 aids in focusing the light onto PD region 115.

CIS 100 includes pixel circuitry 130 disposed adjacent to PD region 115. Pixel circuitry 130 provides a variety of functionality for regular operation of CIS 100. For example, pixel circuitry 130 may include circuitry to commence acquisition of an image charge within PD region 115, to reset the image charge accumulated within PD region 115 to ready CIS 100 for the next image, or to transfer out the image data acquired by CIS 100.

Crosstalk is a serious problem in image sensors. There are three components of crosstalk: a) electrical crosstalk, b) optical crosstalk, and c) color crosstalk. Electrical cross talk is caused by the drifting of charge carriers generated deep in the semiconductor epitaxial layers from their site of generation into neighboring pixels. Optical crosstalk is caused by the diffraction and/or scattering of light off of metal lines and at interfaces between the backend dielectric layers. A major source of optical crosstalk is light incident normal to the flat regions between the microlenses, which hit the metal lines directly underneath and scatter off to neighboring pixels (illustrated in FIGS. 1B and 1C). FIG. 1B is a plan view of eight neighboring CIS 100 within a color filter array 140. The pixels or CIS 100 are arranged within color filter array 140 using a Bayer filter mosaic (e.g., RGBG or GRGB). As illustrated in FIG. 1B, microlenses 125 of each CIS 100 are separated by gaps 145 between the pixels. FIG. 1C illustrates how light incident on gaps 145 scatters off of the metal layers within metal stack 110 into adjacent pixels.

Color crosstalk results from the finite (nonzero) transmittance of color filter 120 to wavelengths outside its target pass band, such as the finite transmittance of green and blue wavelengths through a red filter. To address color crosstalk the thickness of color filter 120 is chosen to maximize the transmittance within its pass band while greatly attenuating outside this range. The resulting color crosstalk may still be unacceptably high for applications which require high color fidelity. One solution is to increase the thickness of color filter 120. However, increasing the thickness also increases the absorption in the pass band, thus reducing the net quantum efficiency. Another disadvantage is the resulting increased backend height, which places microlens 125 further away from PD region 115, further increasing optical crosstalk. Accordingly, a limitation is imposed on thickness of color filter 120.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus and method for fabrication of an image sensor array with conformal color filters are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
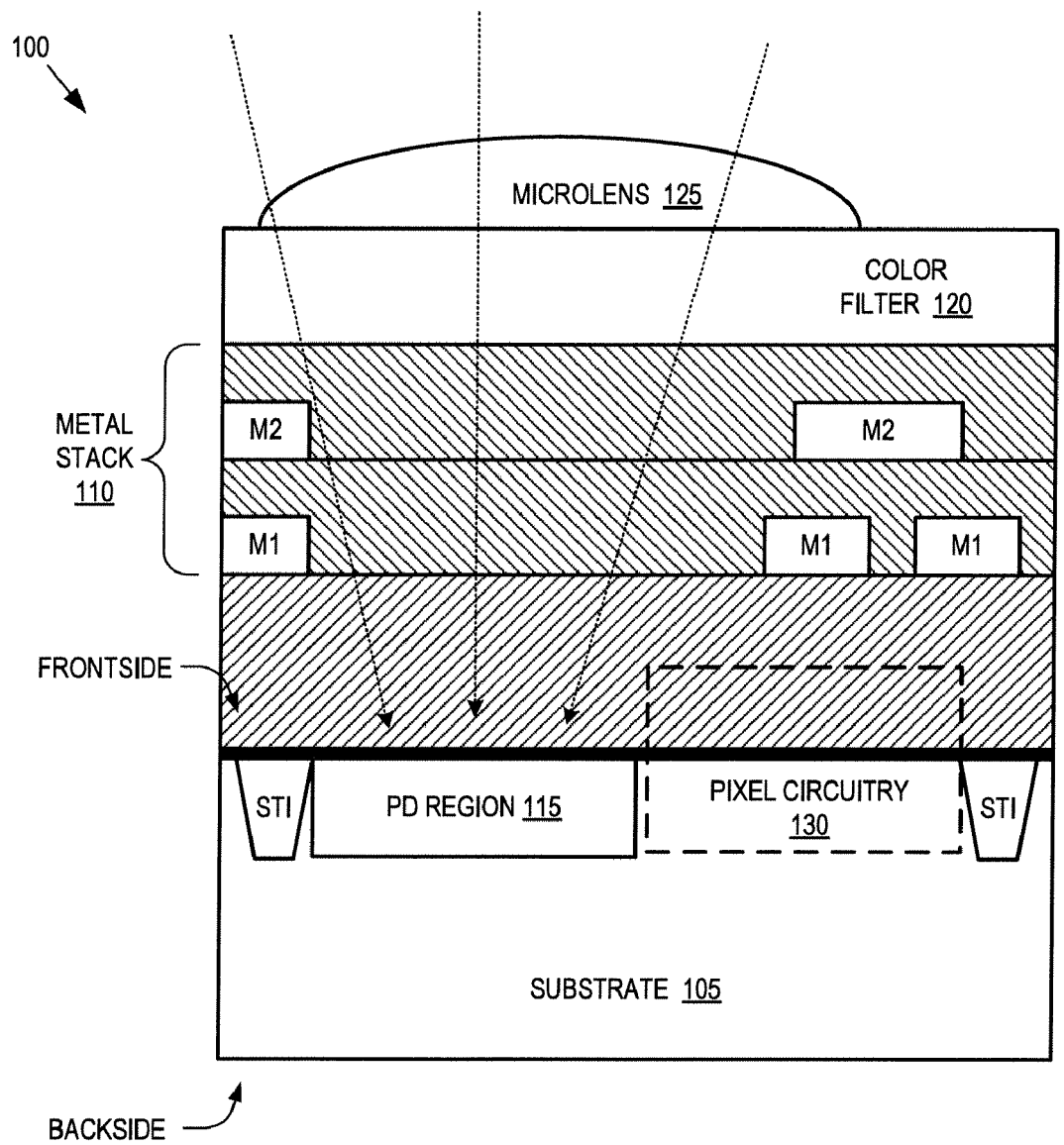
FIG. 1A is a cross sectional view of a conventional frontside illuminated CMOS image sensor.
Figure 1B:
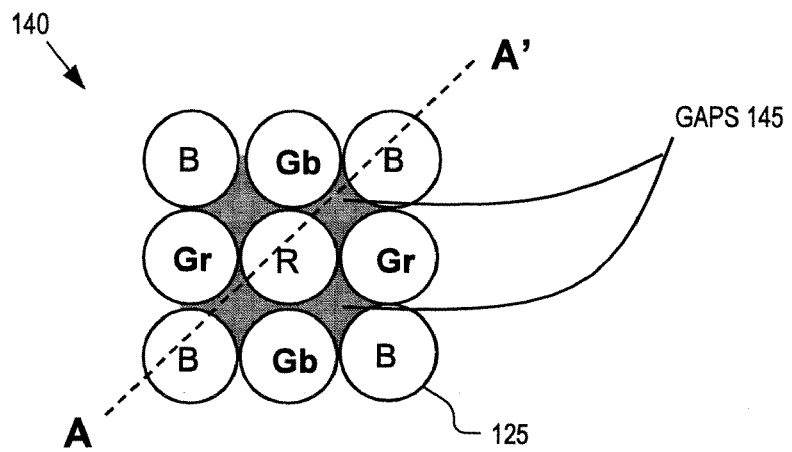
FIG. 1B is a plan view of a conventional color pixel array.
Figure 1C:
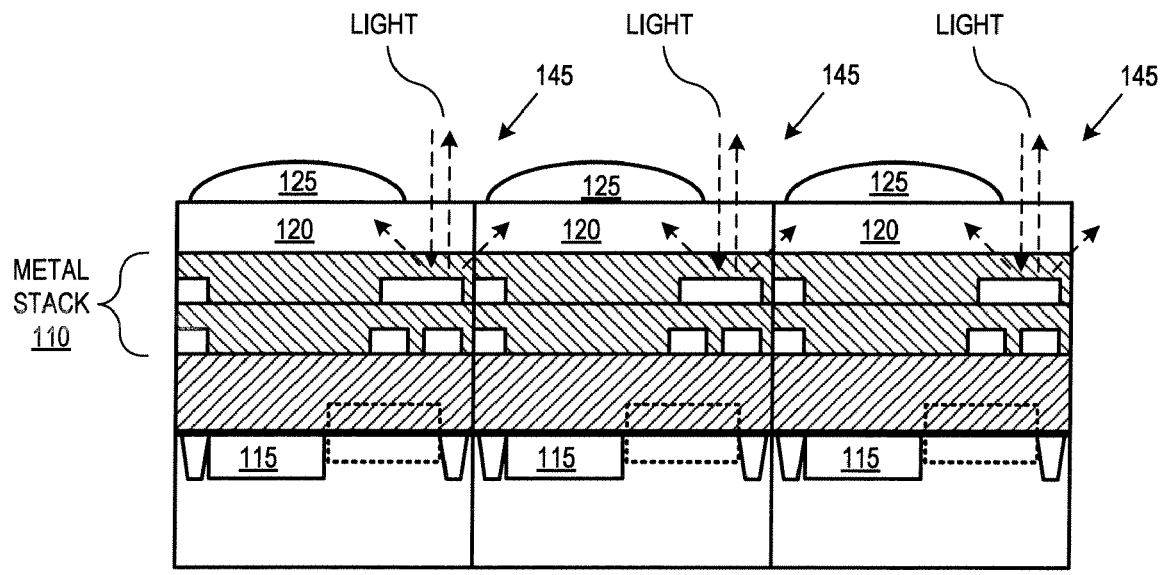
FIG. 1C is a cross sectional view of three neighboring CMOS image sensors within a color pixel array.
Figure 2:
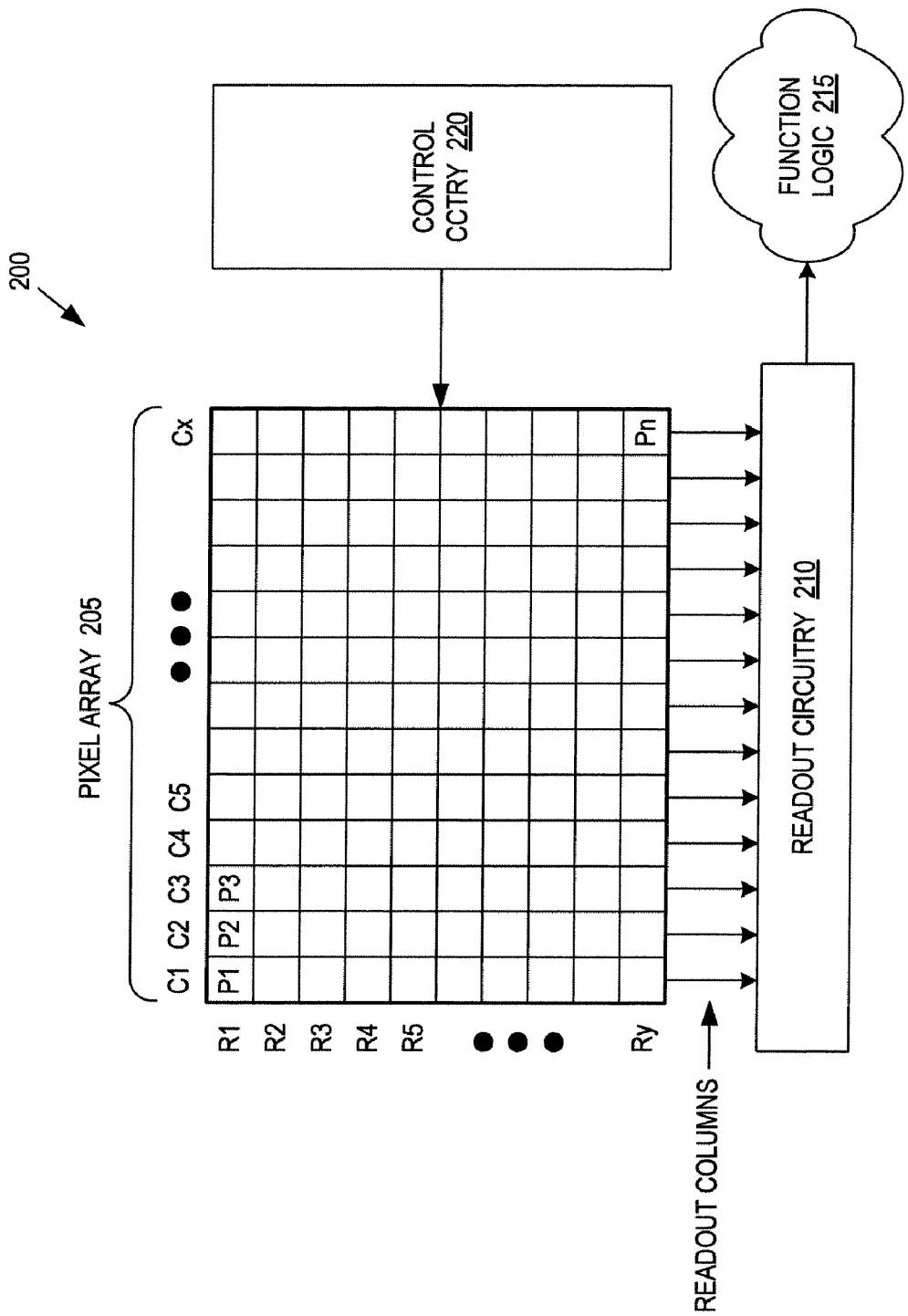
FIG. 2 is a block diagram illustrating an imaging system, in accordance with an embodiment of the invention.

FIG. 2 is a block diagram illustrating an imaging system 200, in accordance with an embodiment of the invention. The illustrated embodiment of imaging system 200 includes an image sensor array 205 having conformal color filters, readout circuitry 210, function logic 215, and control circuitry 220.

Image sensor array 205 is a two-dimensional ("2D") array of image sensors or pixels (e.g., pixels P1, P2 . . . , Pn). In one embodiment, each pixel is a complementary metal-oxide-semiconductor ("CMOS") imaging pixel. Image sensor array 205 may be implemented as either a front side illuminated image sensor array or a backside illuminated image sensor array. In one embodiment, image sensor array 205 includes a color filter pattern, such as a Bayer pattern or mosaic of red, green, and blue additive filters (e.g., RGB, RGBG or GRGB), a color filter pattern of cyan, magenta, yellow, and key (black) subtractive filters (e.g., CMYK), a combination of both, or otherwise. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 210 and transferred to function logic 215. Readout circuitry 210 may include amplification circuitry, analog-to-digital ("ADC") conversion circuitry, or otherwise. Function logic 215 may simply store the image data or even manipulate the image data by applying post image effects (e.g., crop, rotate, remove red eye, adjust brightness, adjust contrast, or otherwise). In one embodiment, readout circuitry 210 may readout a row of image data at a time along readout column lines (illustrated) or may readout the image data using a variety of other techniques (not illustrated), such as a column readout, a serial readout, or a full parallel readout of all pixels simultaneously.

Control circuitry 220 is coupled to image sensor array 205 to control operational characteristic of image sensor array 205. For example, control circuitry 220 may generate a shutter signal for controlling image acquisition. In one embodiment, the shutter signal is a global shutter signal for simultaneously enabling all pixels within image sensor array 205 to simultaneously capture their respective image data during a single acquisition window. In an alternative embodiment, the shutter signal is a rolling shutter signal whereby each row, column, or group of pixels is sequentially enabled during consecutive acquisition windows.

Figure 3:
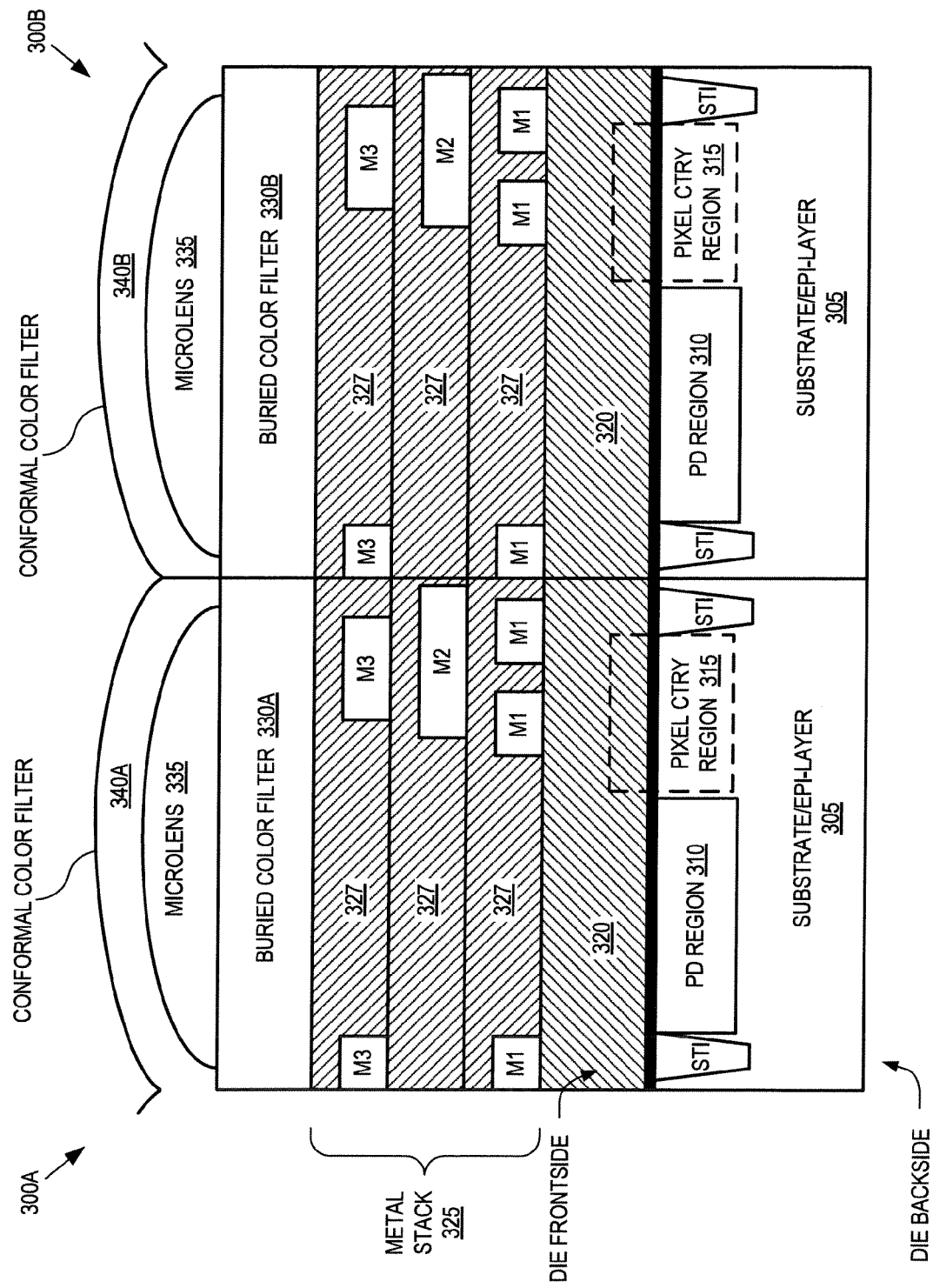
FIG. 3 is a cross sectional view of two adjacent image sensors each having a conformal color filter layer, in accordance with an embodiment of the invention.

FIG. 3 is a cross sectional view of two adjacent image sensors 300A and 300B (collectively image sensors 300) each having a conformal color filter layer, in accordance with an embodiment of the invention. Image sensors 300 represent possible implementations of pixels P1 to Pn within image sensor array 205. The illustrated embodiment of image sensors 300 each include a substrate 305, a photo-sensor or photodiode ("PD") region 310, a pixel circuitry region 315 including pixel circuitry (not illustrated), an inter-layer dielectric 320, a metal stack 325, a buried color filter 330, a microlens 335, and a conformal color filter 340. The illustrated embodiment of metal stack 325 includes three metal layers M1, M2, and M3 separated by inter-metal dielectric layers 327. Although FIG. 3 illustrates a three layer metal stack, metal stack 325 may include more or less layers for routing signals over the front side of image sensor array 205. Finally, shallow trench isolations ("STI") isolate adjacent image sensors 300 from each other.

It should be appreciated some conventional elements of image sensors 300 may not be illustrated in FIG. 3 for clarity. For example, in one embodiment, a passivation or pinning layer (not illustrated) is disposed over PD region 310 or an antireflective ("AR") layer is disposed under microlenses 335 or buried color filters 330. It should further be appreciated that FIG. 3 is not necessarily drawn to scale and the thickness or width of some features may be exaggerated relative to others.

In one embodiment, substrate 305 is doped with P type dopants. In this case, substrate 305 and the epitaxial layers grown thereon may be referred to as a P substrate. In a P type substrate embodiment, P+ well implants are disposed in pixel circuitry regions 315 under the pixel circuitry while PD regions 310 are N type doped. In an embodiment where substrate 305 and the epitaxial layers thereon are N type, N+ well implants are disposed in pixel circuitry regions 315 under the pixel circuitry while PD regions 310 are P type doped.

Light incident on image sensor array 205 is color filtered primarily by buried color filter 330 and secondarily by conformal color filter 340. Microlens 335 and conformal color filter 340 are aligned with optical pass-throughs disposed in metal layers M1, M2, and M3 to focus incident light onto PD region 310 along an optical path extending through metal stack 325. FIG. 3 illustrates image sensors 300 as front side illuminated sensors, which are photosensitive to light incident on the die frontside. However, conformal color filters 340, microlenses 335, and buried color filters 330 could be formed on the die backside to implement a backside illuminated image sensor array, as well.

To achieve greater color filtering over buried color filters 330 alone, conformal color filters 340 are deposited above microlenses 335 and conformal therewith. Instead of increasing the thickness of buried color filters 330 lying below the microlenses 335, microlenses 335 are sandwiched between two layers of color filter material—a flat or planar one and a curved or conformal one.

By positioning a conformal color filter layer over microlenses 335, the dead space or gaps between microlenses 335 are reduced in size or even eliminated by the lateral extensions of conformal color filters 340. These lateral extensions have curved surfaces when conformal color filters 340 are concentrically formed over microlenses 335. This lens enlarging effect is based on the principle that an optically transparent layer whose index of refraction is comparable or substantially equivalent to that of an underlying microlens material, operates to extend the size of the microlens when deposited conformally. Accordingly, conformal color filters 340 may be formed of a material having a substantially similar index of refraction as the underlying microlenses 335. In one embodiment, microlenses 335 are fabricated of a clear polymer material while the color filters are fabricated of a pigmented polymer material. By enlarging microlenses 335 with conformal color filters 340, the quantum efficiency of the image sensor array 205 is increased, since a larger area of incident light is collected at the surface and focused onto PD regions 310. This resulting increase in quantum efficiency in the wavelength pass band counters any additional attenuation due to absorption in the color filter. Outside of the pass band the absorption in the color filter dominates over any potential increase in quantum efficiency (color crosstalk) due to increased light capture and results in reduced color crosstalk. Thus the twin benefits of higher quantum efficiency in the pass band of the color filter and increased attenuation outside the pass band are achieved. In addition, since the flat dead regions on the illuminated surface (e.g., gaps 145) are reduced or eliminated, the optical crosstalk contributed by these regions is also reduced or eliminated.

As discussed, conformal color filters 340 function as secondary color filters, while the flat buried color filters 330 below microlenses 335 function as the primary color filters. As such, conformal color filters 340 can remain relatively thin compared to buried color filters 330 so as to remain conformal with microlens 340. For example a thickness of 0.1 um to 0.3 um may be sufficient; however, the exact thickness is determined by the pixel pitch and/or the optimization parameters for the particular process or application. In one embodiment, conformal color filter 340 and buried color filter 330 of a single pixel filter substantially the same wavelengths. Alternatively, conformal color filter 340 and buried color filter 330 of a single pixel may filter different wavelengths. In one embodiment, the conformal color filters and the buried color filters may be used to implement different filtering schemes. For example, the conformal color filters may implement CMYK filtering while the buried color filters implement RGB filtering.

Figure 4:
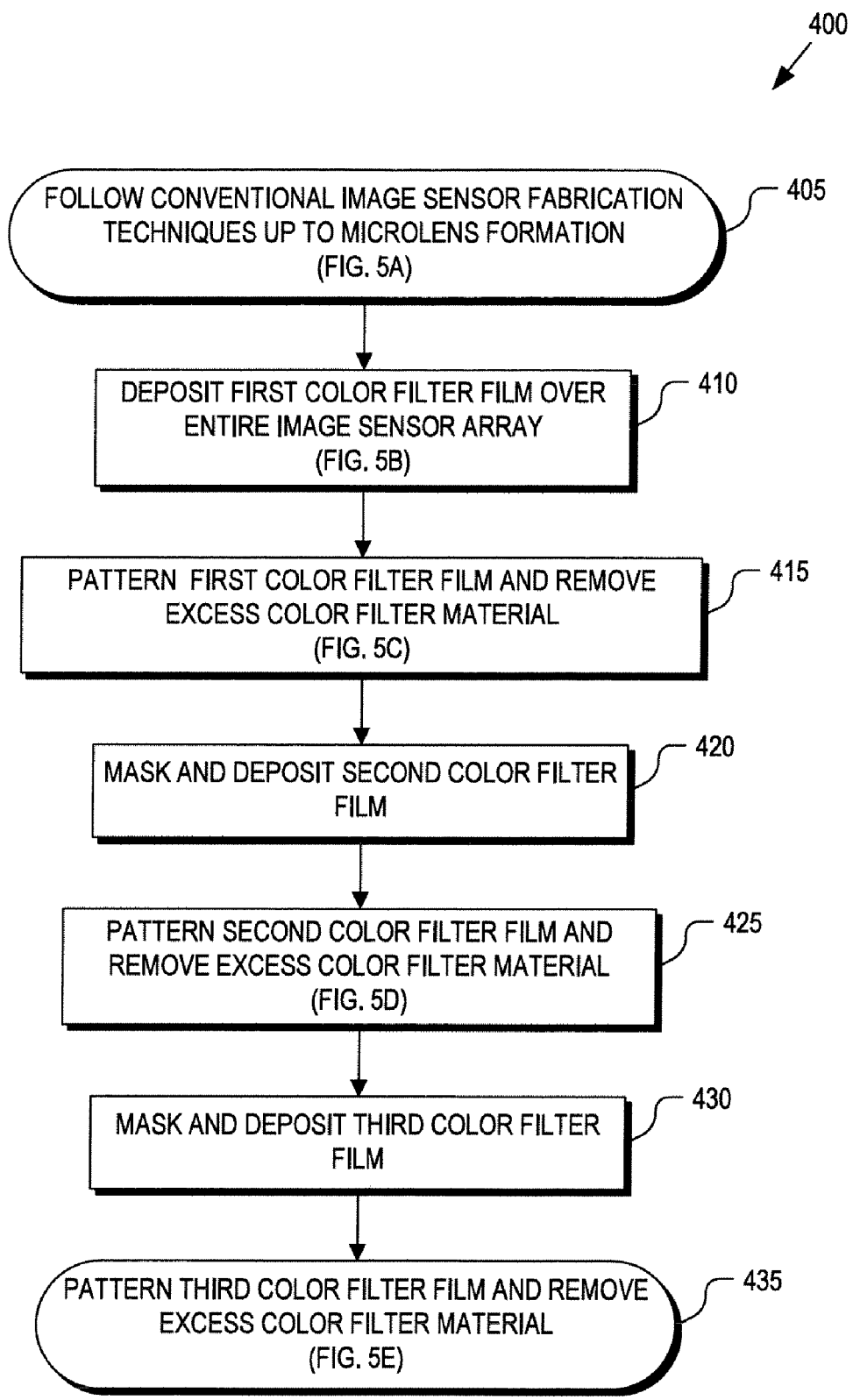
FIG. 4 is a flow chart illustrating a process for fabricating an image sensor array with conformal color filters, in accordance with an embodiment of the invention.

FIG. 4 is a flow chart illustrating a process 400 for fabricating image sensor array 205 with conformal color filters, in accordance with an embodiment of the invention. Process 400 is described with reference to FIGS. 5A-5E. FIGS. 5A-5E illustrate the fabrication of three neighboring image sensors 500A, 500B, and 500C. The order in which some or all of the process blocks appear in process 400 should not be deemed limiting. Rather, one of ordinary skill in the art having the benefit of the present disclosure will understand that some of the process blocks may be executed in a variety of orders not illustrated.

Figure 5A:
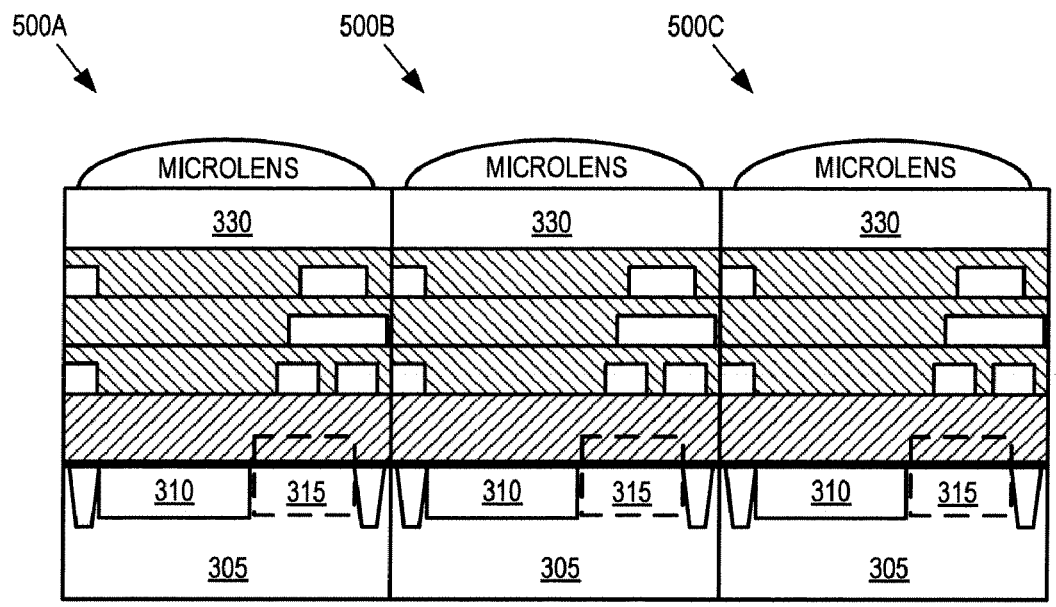
FIG. 5A is a cross sectional view of three neighboring image sensors at a first stage of fabrication, in accordance with an embodiment of the invention.
Figure 5B:
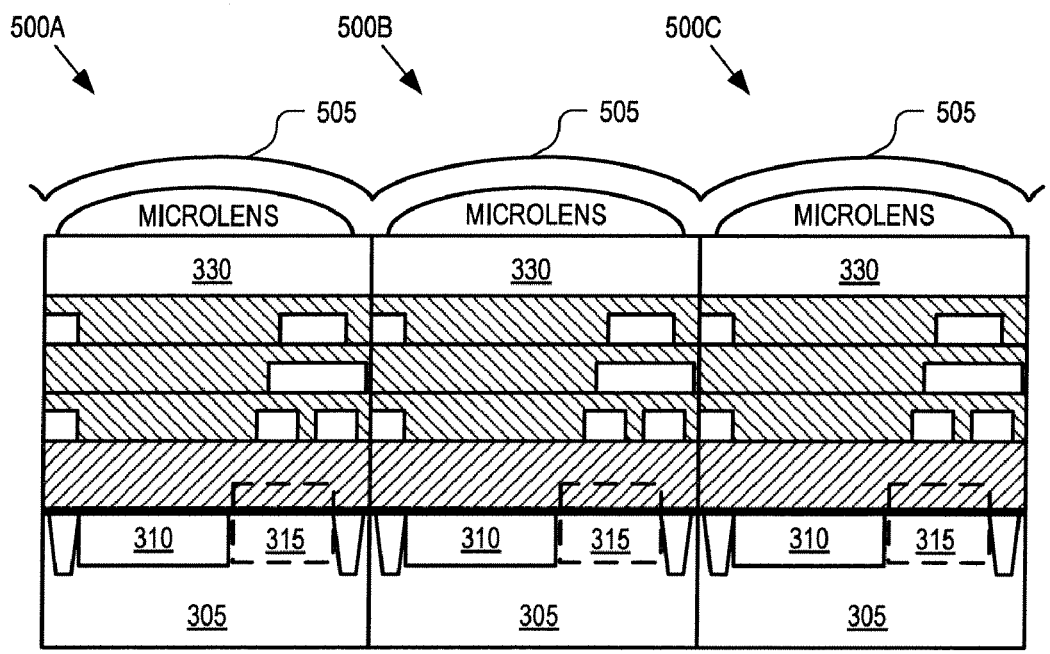
FIG. 5B is a cross sectional view of three neighboring image sensors at a second stage of fabrication, in accordance with an embodiment of the invention.
Figure 5C:
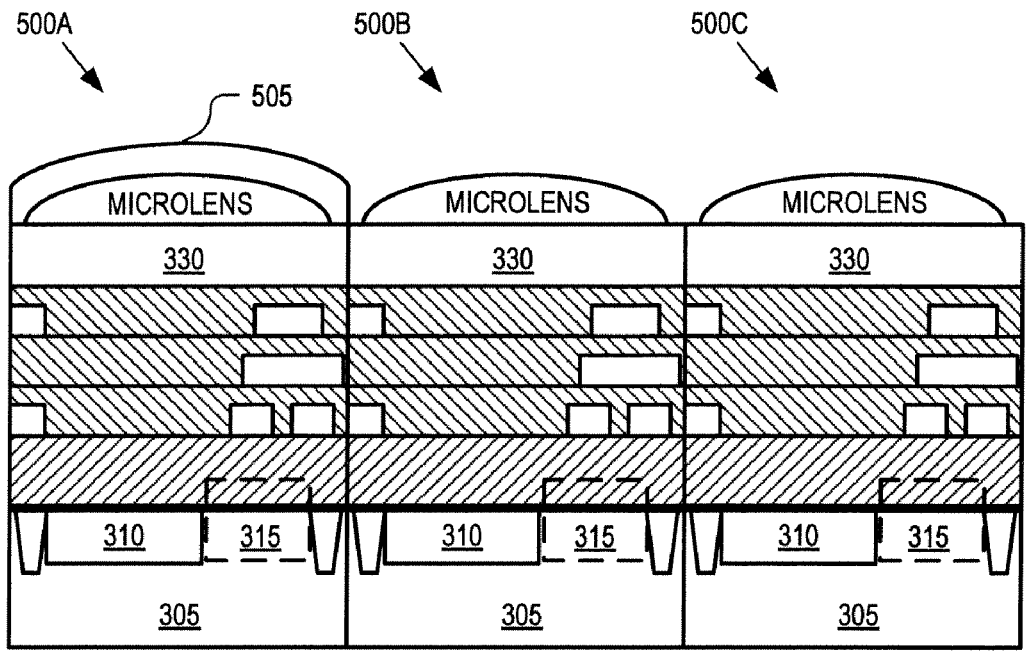
FIG. 5C is a cross sectional view of three neighboring image sensors at a third stage of fabrication, in accordance with an embodiment of the invention.
Figure 5D:
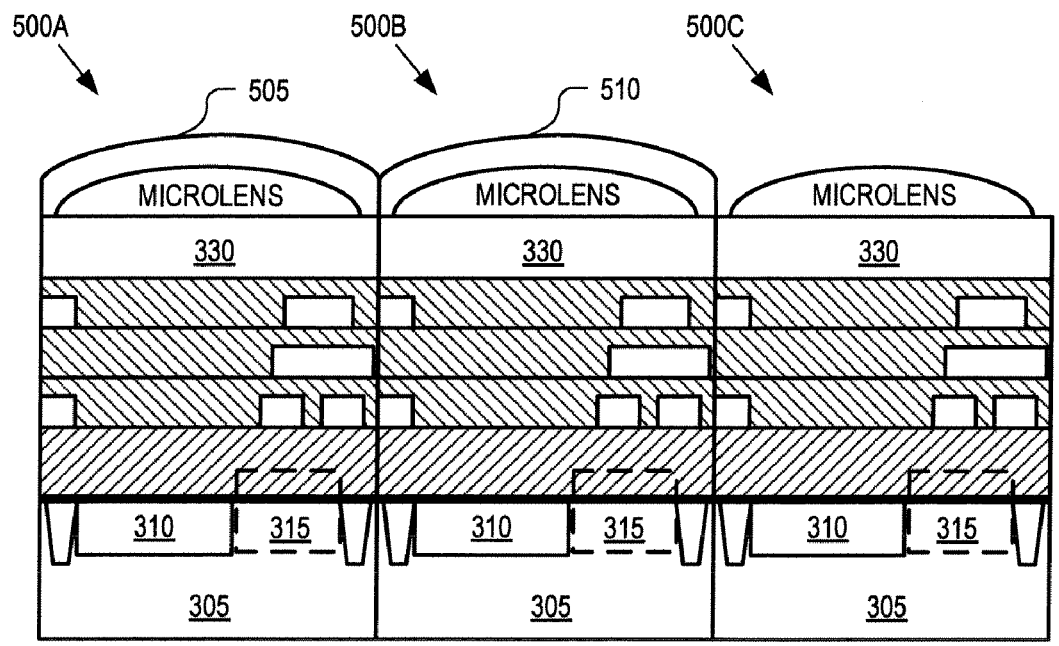
FIG. 5D is a cross sectional view of three neighboring image sensors at a fourth stage of fabrication, in accordance with an embodiment of the invention.
Figure 5E:
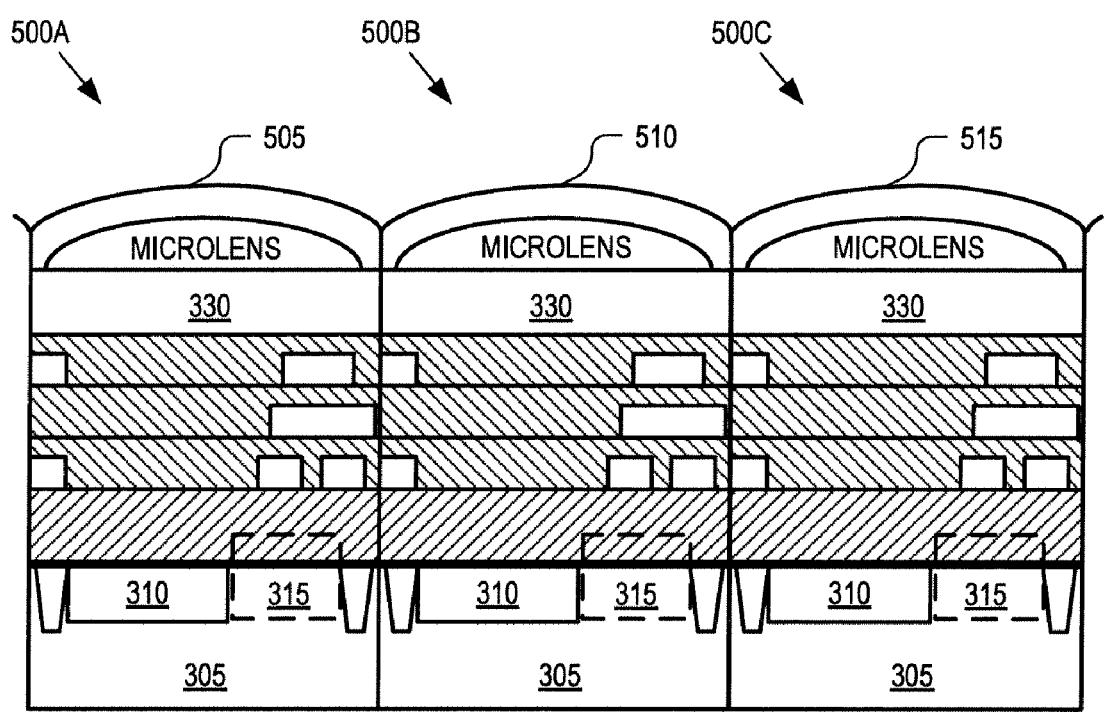
FIG. 5E is a cross sectional view of three neighboring image sensors at a fifth stage of fabrication, in accordance with an embodiment of the invention.

In a process block 405, standard CMOS image sensor processes are followed up to and including the microlens formation (see FIG. 5A). After microlenses 335 have been formed, the first color filter film 505 is deposited as a blanket layer (e.g., spun on) over the microlens array (process block 410; see FIG. 5B). For example, color filter film 505 may be a blue color filter layer. Once deposited, color filter film 505 is patterned using standard lithography techniques so that the color filter film 505 only remains over image sensor 500A, while the remaining excess portions are removed from the other image sensors 500B and 500C (process block 415; FIG. 5C). Although FIGS. 5A-5E only illustrate the fabrication of three image sensors, it should be appreciated that when fabricating image sensor array 205, the array surface would be patterned so that color filter film 505 remained on all similarly colored pixels (e.g., remained over all blue pixels).

In a process block 420, the second color filter film 510 (e.g., green filter) is deposited over the array surface after masking the surface of image sensor 500A. Image sensor 500A is masked to prevent the second color filter film 510 from adhering over the first color filter film 505. In a process block 425, color filter film 510 is patterned using lithography and the excess portions not over image sensor 500B removed (see FIG. 5D).

In a process block 430, the third color filter film 515 (e.g., red filter) is deposited over the array surface after masking the surface of image sensors 500A and 500B. Again, image sensors 500A and 500B are masked to prevent the third color filter film 515 from adhering over the first and second color filter films 505 and 510. In a process block 435, color filter film 515 is patterned using lithography and the excess portions not over image sensor 500C removed (see FIG. 5E). Accordingly, the remaining portions of color filter films 505, 510, and 515 form conformal color filters over image sensors 500A, 500B, and 500C having three different colors. It should be appreciated that the order of forming the different colors of the conformal color filters may be varied.

Figure 6:
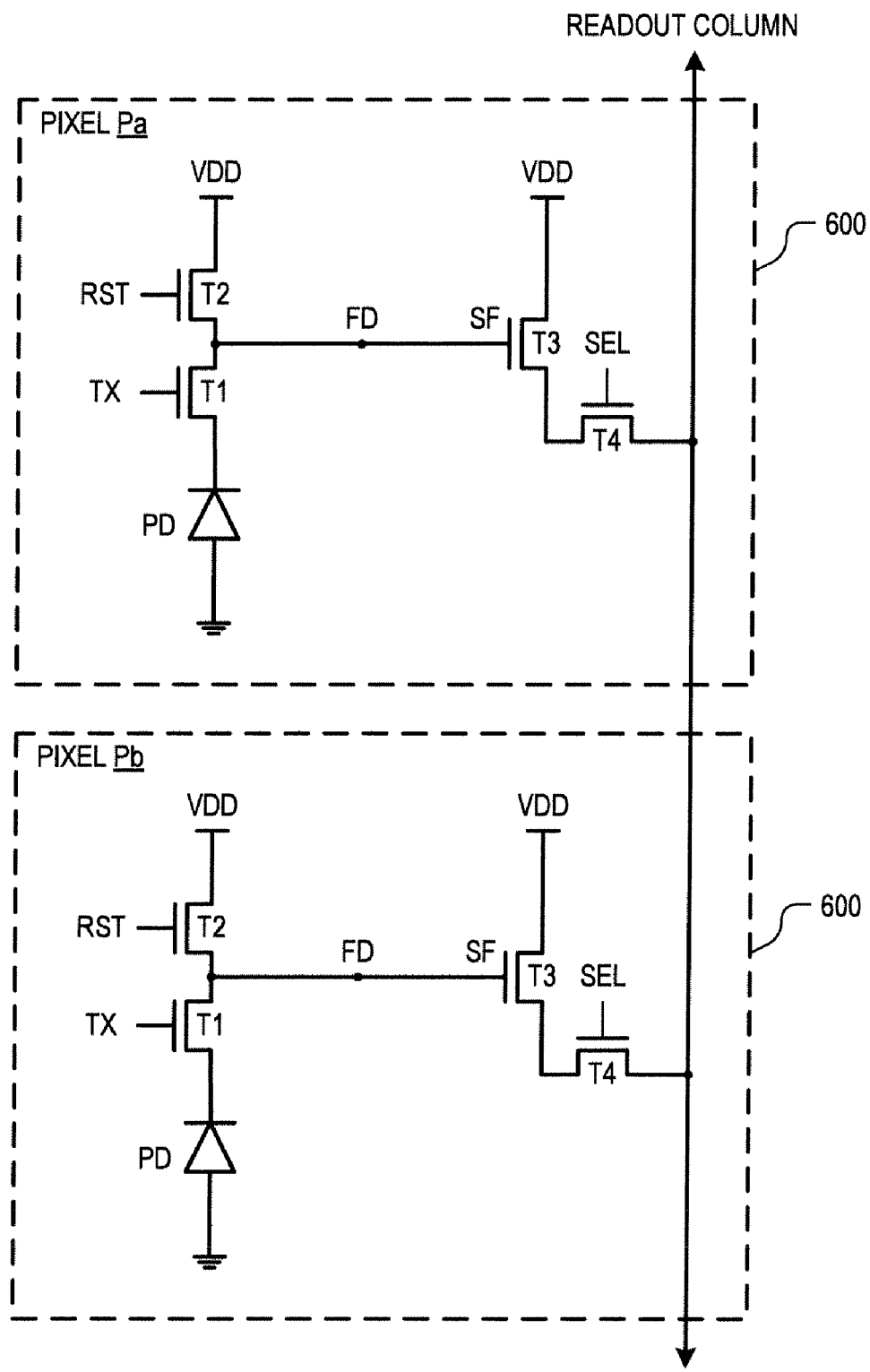
FIG. 6 is a circuit diagram illustrating example pixel circuitry of two pixels within an image sensor array, in accordance with an embodiment of the invention.

FIG. 6 is a circuit diagram illustrating pixel circuitry 600 of two four-transistor ("4T") pixels within an image sensor array, in accordance with an embodiment of the invention. Pixel circuitry 600 is one possible pixel circuitry architecture for implementing each pixel within image sensor array 205 of FIG. 2. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 6, pixels Pa and Pb are arranged in two rows and one column. The illustrated embodiment of each pixel circuitry 600 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD. In one embodiment, floating diffusion node FD may be coupled to a storage capacitor for temporarily storing image charges.

Reset transistor T2 is coupled between a power rail VDD and the floating diffusion node FD to reset the pixel (e.g., discharge or charge the FD and the PD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance connection to the floating diffusion FD. Finally, select transistor T4 selectively couples the output of pixel circuitry 600 to the readout column line under control of a select signal SEL.

In one embodiment, the TX signal, the RST signal, and the SEL signal are generated by control circuitry 220. In an embodiment where image sensor array 205 operates with a global shutter, the global shutter signal is coupled to the gate of each transfer transistor T1 in the entire image sensor array 205 to simultaneously commence charge transfer from each pixel's photodiode PD. Alternatively, rolling shutter signals may be applied to groups of transfer transistors T1.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor pixel, comprising:
    a photo-sensor region disposed within a semiconductor die;
    a microlens disposed on the semiconductor die in optical alignment with the photo-sensor region;
    a first color filter layer disposed between the photo-sensor region and the microlens; and
    a second color filter layer disposed on an opposite side of the microlens as the first color filter layer, wherein the second color filter layer comprises a conformal color filter disposed over the microlens and having a curved surface conformed by a topology of the microlens, wherein the first color filter layer comprises a buried color filter having a substantially planar topology, wherein the image sensor pixel comprises a backside illuminated complementary metal-oxide-semiconductor ("CMOS") image sensor.

2. The image sensor pixel of claim 1, wherein the conformal color filter and the microlens have substantially equivalent indexes of refraction.

3. The image sensor pixel of claim 1, wherein the microlens is sandwiched between the conformal color filter and the buried color filter.

4. The image sensor pixel of claim 1, wherein the conformal and buried color filters filter substantially the same wavelengths.

5. The image sensor pixel of claim 1, wherein the conformal and buried color filters filter different wavelengths.

6. The image sensor pixel of claim 1, wherein the conformal color filter and the buried color filter comprise a pigmented polymer material and the microlens comprises a clear polymer material.

7. The image sensor pixel of claim 1, further comprising a stack of dielectric layers and metal layers disposed between the photo-sensor region and the microlens, wherein the metal layers include optical pass-throughs aligned to expose an optical path from the conformal color filter through the microlens, the buried color filter, and the stack to the photo-sensor region.

8. The image sensor pixel of claim 1, wherein the buried color filter is thicker than the conformal color filter.

9. An imaging system, comprising:
a complementary metal-oxide-semiconductor ("CMOS") array of image sensors wherein each image sensor includes:
a photodiode region disposed within a semiconductor die for accumulating image data in response to light incident upon the CMOS array;
a microlens disposed on the semiconductor die in optical alignment with the photodiode region;
a first color filter layer disposed between the photodiode region and the microlens; and
a second color filter layer disposed on an opposite side of the microlens as the first color filter layer, wherein the second color filter layer comprises a conformal color filter disposed over the microlens and having a curved surface conformed by a topology of the microlens,
wherein the conformal color filter and the microlens have substantially equivalent indexes of refraction; and
readout circuitry coupled to the CMOS array to readout image data from each of the image sensors.

10. The imaging system of claim 9, wherein the CMOS array includes gaps between the microlenses of neighboring image sensors, wherein curved surface of the conformal color filter overlaps neighboring gaps and operates as an extension of the microlens reducing a size of the neighboring gaps.

11. The imaging system of claim 9, wherein the first color filter layer comprises a buried color filter having a substantially planar topology.

12. The imaging system of claim 11, wherein the buried color filter is a primary color filter and the conformal color filter is a secondary color filter, the primary and secondary color filters configured to filter the same wavelengths.

13. The imaging system of claim 9, wherein the first color filter layer uses a different color filter scheme than the second color filter layer.

14. An image sensor pixel, comprising:
a photo-sensor region disposed within a semiconductor die;
a microlens disposed on the semiconductor die in optical alignment with the photo-sensor region;
a first color filter layer disposed between the photo-sensor region and the microlens; and
a second color filter layer disposed on an opposite side of the microlens as the first color filter layer,
wherein the first and second color filters filter substantially the same wavelengths.

15. An image sensor pixel, comprising:
a photo-sensor region disposed within a semiconductor die;
a microlens disposed on the semiconductor die in optical alignment with the photo-sensor region;
a first color filter layer disposed between the photo-sensor region and the microlens; and
a second color filter layer disposed on an opposite side of the microlens as the first color filter layer,
wherein the second color filter layer comprises a conformal color filter disposed over the microlens and having a curved surface,
wherein the first color filter layer comprises a buried color filter,
wherein the image sensor pixel comprises a backside illuminated complementary metal-oxide-semiconductor ("CMOS") image sensor.

\* \* \* \* \*